(12) United States Patent
Machii et al.

(10) Patent No.: US 9,520,529 B2
(45) Date of Patent: Dec. 13, 2016

(54) COMPOSITION FOR FORMING P-TYPE DIFFUSION LAYER, METHOD OF FORMING P-TYPE DIFFUSION LAYER, AND METHOD OF PRODUCING PHOTOVOLTAIC CELL

(71) Applicant: Hitachi Chemical Company, Ltd., Chiyoda-ku, Tokyo (JP)

(72) Inventors: Yoichi Machii, Tsukuba (JP); Masato Yoshida, Tsukuba (JP); Takeshi Nojiri, Tsukuba (JP); Kaoru Okaniwa, Tsukuba (JP); Mitsunori Iwamuro, Tsukuba (JP); Shuichiro Adachi, Tsukuba (JP); Tetsuya Sato, Tsukuba (JP); Keiko Kizawa, Tsukuba (JP)

(73) Assignee: Hitachi Chemical Co., Ltd., Tokyo (JP)

( * ) Notice: Subject to any disclaimer, the term of this patent is extended or adjusted under 35 U.S.C. 154(b) by 0 days.

(21) Appl. No.: 14/076,212

(22) Filed: Nov. 9, 2013

(65) Prior Publication Data

US 2014/0065761 A1 Mar. 6, 2014

Related U.S. Application Data

(62) Division of application No. 13/642,526, filed as application No. PCT/JP2011/059970 on Apr. 22, 2011, now abandoned.

(30) Foreign Application Priority Data

Apr. 23, 2010 (JP) ................ 2010-100223

(51) Int. Cl.
| | |
|---|---|
| H01L 21/00 | (2006.01) |
| H01L 31/18 | (2006.01) |
| C03C 8/16 | (2006.01) |
| C03C 8/18 | (2006.01) |
| H01L 21/22 | (2006.01) |
| H01L 21/225 | (2006.01) |
| H01L 31/032 | (2006.01) |
| H01L 31/0224 | (2006.01) |

(52) U.S. Cl.
CPC ............. H01L 31/1864 (2013.01); C03C 8/16 (2013.01); C03C 8/18 (2013.01); H01L 21/2225 (2013.01); H01L 21/2255 (2013.01); H01L 31/022425 (2013.01); H01L 31/032 (2013.01); H01L 31/1804 (2013.01); Y02E 10/547 (2013.01); Y02P 70/521 (2015.11)

(58) Field of Classification Search
CPC .......... C03C 8/16; C03C 8/18; H01L 21/2225; H01L 21/2255
USPC .................................... 438/85, 98
See application file for complete search history.

(56) References Cited

U.S. PATENT DOCUMENTS

| | | | |
|---|---|---|---|
| 2,794,846 A | 6/1957 | Fuller | |
| 4,891,331 A | 1/1990 | Rapp | |
| 4,929,572 A * | 5/1990 | Saito et al. | 438/567 |
| 5,145,510 A | 9/1992 | Saito et al. | |
| 5,899,704 A | 5/1999 | Schlosser et al. | |
| 6,695,903 B1 * | 2/2004 | Kunelbeck et al. | 106/287.14 |
| 2005/0160970 A1 | 7/2005 | Niira et al. | |
| 2007/0215202 A1 | 9/2007 | Salami et al. | |
| 2010/0136314 A1 * | 6/2010 | Umayahara et al. | 428/220 |
| 2010/0154875 A1 * | 6/2010 | Borland et al. | 136/255 |
| 2010/0186823 A1 * | 7/2010 | Hsu | 136/263 |
| 2010/0258165 A1 | 10/2010 | Carroll et al. | |
| 2012/0040490 A1 | 2/2012 | Gallazzo et al. | |
| 2014/0352778 A1 * | 12/2014 | Yang et al. | 136/256 |

FOREIGN PATENT DOCUMENTS

| | | |
|---|---|---|
| JP | 02-162720 A | 6/1990 |
| JP | H02177569 | 7/1990 |
| JP | 04-158514 A | 6/1992 |
| JP | 04-174517 A | 6/1992 |
| JP | 2002539615 | 11/2002 |
| JP | 2003-223813 A | 8/2003 |
| JP | 2009-117729 A | 5/2009 |
| JP | 2009-177129 A | 8/2009 |
| JP | 2009-200276 A | 9/2009 |
| JP | 2009200276 | 9/2009 |
| JP | 2010-074149 A | 4/2010 |
| KR | 10-1192-0005467 B1 | 7/1992 |
| TW | 492081 | 6/2002 |
| TW | 492081 B | 6/2002 |
| TW | 201007770 A | 2/2010 |
| WO | WO 2008/085806 | 7/2008 |
| WO | WO 2009/060761 A1 | 5/2009 |

OTHER PUBLICATIONS

M.G. Hawes, The Platinum Metals in Glass, 1957, Platinum Metals Rev. 1(2), 44-48.
Extended European Search Report dated Aug. 13, 2013, in European Patent Application No. 11772109.2.
U.S. Appl. No. 13/642,525, filed Dec. 5, 2012.
Non-Final Office Action dated Aug. 6, 2013, in U.S. Appl. No. 13/642,525.
Final Office Action dated Dec. 20, 2013, in U.S. Appl. No. 13/642,526.
Office Action issued Aug. 27, 2014, in Taiwanese Patent Application No. 10321168050.

(Continued)

Primary Examiner — Reema Patel
Assistant Examiner — Syed Gheyas
(74) Attorney, Agent, or Firm — Seyfarth Shaw LLP

(57) ABSTRACT

The composition for forming a composition for forming a p-type diffusion layer, the composition containing a glass powder and a dispersion medium, in which the glass powder includes an acceptor element and a total amount of a life time killer element in the glass powder is 1000 ppm or less. A p-type diffusion layer and a photovoltaic cell having a p-type diffusion layer are prepared by applying the composition for forming a p-type diffusion layer, followed by a thermal diffusion treatment.

8 Claims, No Drawings

(56) References Cited

OTHER PUBLICATIONS

Extended European Search Report dated Aug. 25, 2014, in European Patent Application No. 11772108.4.
Office Action issued Nov. 5, 2014, in European Patent Application No. 11772109.2.
Taiwanese Office Action dated Dec. 12, 2014.
Anonymous: "Boron Trioxide—Wikipedia, the free encyclopedia", Jul. 15, 2015, XP055203225, Retrieved from the Internet: URL:https://en.wikipedia.org/wiki/Boron_trioxide [retreived on Jul. 17, 2015].
Summons to Attend Oral Proceedings Pursuant to Rule 115(1) EPC issued Aug. 4, 2015 in European Patent Application No. 11772109.2.
Office Action issued in Japanese Patent Application No. 2014-035733, mailed Sep. 8, 2015.

* cited by examiner

US 9,520,529 B2

COMPOSITION FOR FORMING P-TYPE DIFFUSION LAYER, METHOD OF FORMING P-TYPE DIFFUSION LAYER, AND METHOD OF PRODUCING PHOTOVOLTAIC CELL

TECHNICAL FIELD

The present invention relates to a composition for forming a p-type diffusion layer of a photovoltaic cell, a method of forming a p-type diffusion layer, and a method of producing a photovoltaic cell. More specifically, the present invention relates to a technique for forming a p-type diffusion layer, which enables reduction in internal stress of a silicon serving as a semiconductor substrate, whereby damage to a crystal grain boundary can be suppressed and increase in crystal defects and warpage can be suppressed.

BACKGROUND ART

A related art procedure of a silicon photovoltaic cell is described hereinbelow.

First, in order to realize high efficiency by promoting optical confinement effects, a p-type silicon substrate having a texture structure formed thereon is prepared, and subsequently subjected to a treatment at a temperature of from 800 to 900° C. for several tens of minutes under a mixed gas atmosphere of phosphorus oxychloride ($POCl_3$), nitrogen and oxygen, thereby uniformly forming an n-type diffusion layer. According to this related art method, since diffusion of phosphorus is carried out using a mixed gas, the n-type diffusion layer is formed not only on the surface, but also on the side face and the rear surface. For these reasons, there has been a need for a side etching process to remove the n-type diffusion layer of the side face. Further, the n-type diffusion layer of the rear surface needs to be converted into a $p^+$-type diffusion layer, and correspondingly an aluminum paste is applied to the n-type diffusion layer of the rear surface and then sintered to achieve conversion of the n-type diffusion layer into the $p^+$-type diffusion layer and also formation of ohmic contact at the same time.

However, aluminum paste has low conductivity, and therefore, it is generally necessary to form a thick aluminum layer of about 10 to 20 μm after sintering on the entire rear surface in order to reduce the sheet resistance. Further, the coefficient of thermal expansion of aluminum is considerably different from the coefficient of thermal expansion of silicon, and therefore, such a difference results in generation of large internal stress in the silicon substrate during the sintering and cooling processes, which contributes to damage to a crystal grain boundary, increase in the crystal defects, and the warpage.

In order to solve this problem, there has been a method to reduce the thickness of the rear surface electrode by decreasing the amount of a paste composition to be coated. However, when the coating amount of the paste composition is decreased, the amount of aluminum diffused from a surface of a p-type silicon substrate into an internal portion is insufficient. As a result, a desirable BSF (Back Surface Field) effect (an effect in which collection efficiency of generated carriers is increased due to the presence of a $p^+$-type layer) is not achieved, resulting in the problem of a decrease in properties of a photovoltaic cell.

For these reasons, for example, in Japanese Patent Application Laid-Open (JP-A) No. 2003-223813, there has been proposed a paste composition including an aluminum powder, an organic vehicle, and an inorganic compound powder whose coefficient of the thermal expansion is lower than that of aluminum, and whose at least one of melting temperature, softening temperature and decomposition temperature is lower than the melting temperature of aluminum.

SUMMARY OF INVENTION

Technical Problem

Even when the paste composition described in JP-A No. 2003-223813 is used, however, it is found that a warpage cannot be sufficiently suppressed in some cases.

The present invention has been made in view of the above problems exhibited by the background art, and it is an object of the present invention to provide: a composition for forming a p-type diffusion layer in a manufacturing process of a photovoltaic cell using a silicon substrate, which is capable of forming a p-type diffusion layer, suppressing generation of internal stress and warpage of a silicon substrate, and which does not significantly shorten a life time of a carrier in the resultant substrate including the p-type diffusion layer; a method of forming a p-type diffusion layer; and a method of producing a photovoltaic cell.

Means for Solving Problems

The above-stated problems are addressed by the following means.

<1> A composition for forming a p-type diffusion layer, the composition containing a glass powder and a dispersion medium, in which the glass powder includes an acceptor element and a total amount of a life time killer element in the glass powder is 1000 ppm or less.

<2> The composition for forming a p-type diffusion layer according to <1>, in which the acceptor element is at least one selected from boron (B), aluminum (Al) or gallium (Ga).

<3> The composition for forming a p-type diffusion layer according to <1> or <2>, in which the acceptor element-containing glass powder contains:

at least one acceptor element-containing material selected from $B_2O_3$, $Al_2O_3$ or $Ga_2O_3$, and at least one glass component material selected from $SiO_2$, $K_2O$, $Na_2O$, $Li_2O$, $BaO$, $SrO$, $CaO$, $MgO$, $BeO$, $ZnO$, $PbO$, $CdO$, $Tl_2O$, $SnO$, $ZrO_2$ or $MoO_3$.

<4> The composition for forming a p-type diffusion layer according to any one of <1> to <3>, in which the life time killer element is at least one selected from iron (Fe), copper (Cu), nickel (Ni), manganese (Mn), chromium (Cr), tungsten (W) or gold (Au).

<5> A method of forming a p-type diffusion layer, the method including:

applying the composition for forming a p-type diffusion layer of any one of <1> to <4>; and conducting a thermal diffusion treatment.

<6> A method of producing a photovoltaic cell, the method including:

applying, on a semiconductor substrate, the composition for forming a p-type diffusion layer of any one of <1> to <4>;

conducting a thermal diffusion treatment to form a p-type diffusion layer; and forming an electrode on the p-type diffusion layer.

Advantageous Effects of Invention

The present invention enables the formation of a p-type diffusion layer in the manufacturing process of a photovoltaic cell using a silicon substrate, suppressing generation of internal stress and warpage of a silicon substrate, and which does not significantly shorten a life time of a carrier in the substrate including the resultant p-type diffusion layer.

DESCRIPTION OF EMBODIMENTS

First, a composition for forming a p-type diffusion layer in accordance with the present invention will be described, and then a method of forming a p-type diffusion layer and a method of producing a photovoltaic cell, using the composition for forming a p-type diffusion layer, will be described.

In the present specification, the term "process" denotes not only independent processes but also processes that cannot be clearly distinguished from other processes as long as a purpose is accomplished by the process.

Furthermore, in the present specification, "from . . . to . . ." denotes a range including each of the minimum value and the maximum value of the values described in this expression.

Further, in the case in which the plurality of the materials corresponding to each component are present in the composition, the amount of each component in the composition means a total amount of plural materials present in the composition unless otherwise specified.

The composition for forming a p-type diffusion layer in accordance with the present invention includes at least a glass powder and a dispersion medium, in which the glass powder includes at least an acceptor element and a total amount of a life time killer element of the glass powder is 1000 ppm or less (hereinafter, often referred to simply as "glass powder") and a dispersion medium, and may further contain other additives as necessary, taking into consideration coatability or the like.

As used herein, the term "composition for forming a p-type diffusion layer" refers to a material which contains an acceptor element and is capable of forming a p-type diffusion layer through thermal diffusion of the acceptor element after application of the material to a silicon substrate. The use of the composition for forming a p-type diffusion layer ensures that a process of forming a $p^+$-type diffusion layer and a process of forming ohmic contact are separated, whereby the options for the electrode material for forming ohmic contact are expanded, and the options for the structure of the electrode are also expanded. For example, when a low resistance material like Ag is applied to an electrode, an electrode having a thin film thickness and low resistance can be achieved. Further, there is no need to form an electrode on the whole surface, and therefore, the electrode may be partially formed such as a comb-shaped electrode. As mentioned above, due to forming a thin or partial electrode such a comb-shaped electrode, it is possible to form a p-type diffusion layer, while suppressing an internal stress in a silicon substrate and warpage of the substrate.

Accordingly, when the composition for forming a p-type diffusion layer in accordance with the present invention is employed, internal stress in a silicon substrate and warpage of the substrate, which occur in the conventionally widely used method, namely a method in which an aluminum paste is applied to the n-type diffusion layer and then sintered to convert the n-type diffusion layer into the $p^+$-type diffusion layer and also to form ohmic contact at the same time, are suppressed.

Furthermore, since the acceptor element included in the glass powder is hardly vaporized during sintering, formation of the p-type diffusion layer in areas other than a desired area due to vaporization of the acceptor element is suppressed. It is assumed that the reason for this is that the acceptor component combines with an element in a glass powder, or is absorbed into the glass, as a result of which the acceptor component is hardly volatilized.

In addition, in the composition for forming a p-type diffusion layer according to the present invention, since a total amount of the life time killer element in the glass powder of the composition is 1000 ppm or less, a life time of a carrier in the substrate having the p-type diffusion layer does not significantly shorten. Details of the life time killer element are described later.

The acceptor element-containing glass powder in accordance with the present invention will be described in more detail.

As used herein, the term "acceptor element" refers to an element which is capable of forming a p-type diffusion layer by doping thereof on a silicon substrate. As the acceptor element, elements of Group XIII of the periodic table can be used. Examples of the acceptor element include B (boron), aluminum (Al) and gallium (Ga).

Examples of the acceptor element-containing material which is used for introducing the acceptor element into the glass powder include $B_2O_3$, $Al_2O_3$ and $Ga_2O_3$. At least one selected from $B_2O_3$, $Al_2O_3$ and $Ga_2O_3$ is preferably used.

Further, the melting temperature, softening point, glass-transition point, chemical durability, and the like of the acceptor element-containing glass powder may be controlled by adjusting the component ratio, if necessary. Further, a below-mentioned glass component material(s) may be preferably contained.

Examples of the glass component material include $SiO_2$, $K_2O$, $Na_2O$, $Li_2O$, $BaO$, $SrO$, $CaO$, $MgO$, $BeO$, $ZnO$, $PbO$, $CdO$, $Tl_2O$, $V_2O_5$, $SnO$, $ZrO_2$, $MoO_3$, $La_2O_3$, $Nb_2O_5$, $Ta_2O_5$, $Y_2O_3$, $TiO_2$, $GeO_2$, $TeO_2$, and $Lu_2O_3$. At least one selected from $SiO_2$, $K_2O$, $Na_2O$, $Li_2O$, $BaO$, $SrO$, $CaO$, $MgO$, $BeO$, $ZnO$, $PbO$, $CdO$, $Tl_2O$, $SnO$, $ZrO_2$ and $MoO_3$ is preferably used.

Specific examples of the acceptor element-containing glass powder include those including both the acceptor element-containing material and the glass component material such as, for example, $B_2O_3$ based glass which includes $B_2O_3$ as the acceptor element such as $B_2O_3$—$SiO_2$ (the acceptor element-containing material and the glass component material are listed in this order, and are listed in the same order below) based glass, $B_2O_3$—$ZnO$ based glass, $B_2O_3$—$PbO$ based glass or single $B_2O_3$ based glass; $Al_2O_3$ based glass which includes $Al_2O_3$ as the acceptor element such as $Al_2O_3$—$SiO_2$ based glass; and $Ga_2O_3$ based glass which includes $Ga_2O_3$ as the acceptor element such as $Ga_2O_3$—$SiO_2$ based glass.

The acceptor element-containing glass powder may include two or more acceptor element-containing materials such as $Al_2O_3$—$B_2O_3$, $Ga_2O_3$—$B_2O_3$ or the like.

Although composite glasses containing one or two components are illustrated in the above, composite glass containing three or more components, such as $B_2O_3$—$SiO_2$—$Na_2O$ or $B_2O_3$—$SiO_2$—$CeO_2$, may also be possible.

A total amount of an element which makes a life time of a carrier shortened (life time killer element) is 1000 ppm or less, preferably 500 ppm or less, more preferably 100 ppm or less, and still more preferably 50 ppm or less, in a glass power.

A life time killer element includes Fe, Cu, Ni, Mn, W and Au. The amount of the element may be analyzed by ICP mass spectrometer, ICP optical emission spectrometer or atomic absorption spectrometer. A life time of a carrier may be measured by microwave reflectance photoconductivity decay (µ-PCD) method.

The content of the glass component material in the glass powder is preferably appropriately set taking into consideration the melting temperature, the softening point, the glass-transition point, and chemical durability. Generally, the content of the glass component material in the glass powder is preferably from 0.1% by mass to 95% by mass, and more preferably from 0.5% by mass to 90% by mass.

The softening point of the glass powder is preferably in the range of from 200° C. to 1000° C., and more preferably from 300° C. to 900° C., from the viewpoint of diffusivity during the diffusion treatment, and dripping. The softening point of the glass powder may be measured by a known differential thermal analysis (DTA) and using an endothermic peak thereof.

The shape of the glass powder includes a substantially substantially spherical shape, a flat shape, a block shape, a plate shape, a scale-like shape, and the like. From the viewpoint of coating property and uniform dispersion property of a composition for forming n-type diffusion layer including a glass powder, it is preferably a substantially spherical shape, a flat shape, or a plate shape.

The particle diameter of the glass powder is preferably 50 µm or less. When a glass powder having a particle diameter of 50 µm or less is used, a smooth coated film may be easily obtained. Further, the particle diameter of the glass powder is more preferably 10 µm or less. The lower limit of the particle diameter is not particularly limited, and preferably 0.01 µm or more.

The particle diameter of the glass powder means the average particle diameter, and may be measured by laser diffraction particle size analyzer or the like.

The acceptor element-containing glass powder is prepared according to the following procedure.

First, raw materials are weighed and filled in a crucible. The crucible may be made of platinum, platinum-rhodium, iridium, alumina, quartz, carbon, or the like, which is appropriately selected taking into consideration the melting temperature, atmosphere, reactivity with melted materials, and the like.

Next, the raw materials are heated to a temperature corresponding to the glass composition in an electric furnace, thereby preparing a melted liquid. At this time, stirring is preferably applied such that the melted liquid becomes homogenous.

Subsequently, the melted liquid is allowed to flow on a zirconia plate, carbon plete or the like to result in vitrification of the solution.

Finally, the glass is pulverized into a powder. The pulverization can be carried out by using a known method such as jet mill, bead mill or ball mill.

The content of the acceptor element-containing glass powder in the composition for forming a p-type diffusion layer is determined taking into consideration coatability, diffusivity of acceptor elements, and the like. Generally, the content of the glass powder in the composition for forming a p-type diffusion layer is preferably from 0.1% by mass to 95% by mass, and more preferably from 1% by mass to 90% by mass.

Hereinafter, a dispersion medium will be described.

The dispersion medium is a medium which disperses the glass powder in the composition. Specifically, a binder, a solvent or the like is employed as the dispersion medium.

For example, the binder may be appropriately selected from a dimethylaminoethyl (meth)acrylate polymer, polyvinyl alcohol, polyacrylamides, polyvinyl amides, polyvinyl pyrrolidone, poly(meth)acrylic acids, polyethylene oxides, polysulfonic acid, acrylamide alkyl sulfonic acid, cellulose ethers, cellulose derivatives, carboxymethylcellulose, hydroxyethylcellulose, ethylcellulose, gelatin, starch and starch derivatives, sodium alginates, xanthane, guar and guar derivatives, scleroglucan and scleroglucan derivatives, tragacanth and tragacanth derivatives or dextrin and dextrin derivatives, acrylic acid resins, acrylic acid ester resins, butadiene resins, styrene resins, copolymers thereof, silicon dioxide, and the like. These compounds may be used individually or in a combination of two or more thereof.

The molecular weight of the binder is not particularly limited and is preferably appropriately adjusted taking into consideration a desired viscosity of the composition.

Examples of the solvent include ketone solvents such as acetone, methylethylketone, methyl-n-propylketone, methyl-iso-propylketonc, methyl-n-butylketone, methyl-iso-butylketone, methyl-n-pentylketone, methyl-n-hexylketone, diethylketone, dipropylketone, di-iso-butylketone, trimethylnonanone, cyclohexanone, cyclopentanone, methylcyclohexanone, 2,4-pentanedione and acetonylacetone; ether solvents such as diethyl ether, methyl ethyl ether, methyl-n-propyl ether, di-iso-propyl ether, tetrahydrofuran, methyl tetrahydrofuran, dioxane, dimethyl dioxane, ethylene glycol dimethyl ether, ethylene glycol diethyl ether, ethylene glycol di-n-propyl ether, ethylene glycol dibutyl ether, diethylene glycol dimethyl ether, diethylene glycol diethyl ether, diethylene glycol methyl ethyl ether, diethylene glycol methyl n-propyl ether, diethylene glycol methyl n-butyl ether, diethylene glycol di-n-propyl ether, diethylene glycol di-n-butyl ether, diethylene glycol methyl n-hexyl ether, triethylene glycol dimethyl ether, triethylene glycol diethyl ether, triethylene glycol methyl ethyl ether, triethylene glycol methyl n-butyl ether, triethylene glycol di-n-butyl ether, triethylene glycol methyl n-hexyl ether, tetraethylene glycol dimethyl ether, tetraethylene glycol diethyl ether, tetradiethylene glycol methyl ethyl ether, tetraethylene glycol methyl n-butyl ether, diethylene glycol di-n-butyl ether, tetraethylene glycol methyl n-hexyl ether, tetraethylene glycol di-n-butyl ether, propylene glycol dimethyl ether, propylene glycol diethyl ether, propylene glycol di-n-propyl ether, propylene glycol dibutyl ether, dipropylene glycol dimethyl ether, dipropylene glycol diethyl ether, dipropylene glycol methyl ethyl ether, dipropylene glycol methyl n-butyl ether, dipropylene glycol di-n-propyl ether, dipropylene glycol di-n-butyl ether, dipropylene glycol methyl n-hexyl ether, tripropylene glycol dimethyl ether, tripropylene glycol diethyl ether, tripropylene glycol methyl ethyl ether, tripropylene glycol methyl n-butyl ether, tripropylene glycol di-n-butyl ether, tripropylene glycol methyl n-hexyl ether, tetrapropylene glycol dimethyl ether, tetrapropylene glycol diethyl ether, tetradipropylene glycol methyl ethyl ether, tetrapropylene glycol methyl n-butyl ether, dipropylene glycol di-n-butyl ether, tetrapropylene glycol methyl n-hexyl ether, and tetrapropylene glycol di-n-butyl ether; ester solvents such as methyl acetate, ethyl acetate, n-propyl acetate, i-propyl acetate, n-butyl acetate, i-butyl acetate, sec-butyl acetate, n-pentyl acetate, sec-pentyl acetate, 3-methoxybutyl acetate, methyl pentyl acetate, 2-ethyl butyl acetate, 2-ethyl hexyl acetate, 2-(2-butoxyethoxy) ethyl acetate, benzyl acetate, cyclohexyl acetate, methyl cyclohexyl acetate, nonyl acetate, methyl acetoacetate, ethyl acetoacetate, diethylene glycol monomethyl ether acetate, diethylene glycol monoethyl ether acetate, diethylene glycol mono-n-butyl ether acetate, dipropylene glycol monomethyl ether acetate, dipropylene glycol monoethyl ether acetate, glycol diacetate, methoxy triglycol acetate, ethyl propionate, n-butyl propionate, i-amyl propionate, diethyl oxalate, di-n-butyl oxalate, methyl lactate, ethyl lactate, n-butyl lactate, n-amyl lactate, ethylene glycol methyl ether propionate, ethylene glycol ethyl ether propionate, ethylene glycol methyl ether acetate, ethylene glycol ethyl ether acetate, diethylene glycol methyl ether acetate, diethylene glycol ethyl ether acetate, diethylene glycol-n-butyl ether acetate, propylene glycol methyl ether acetate, propylene glycol ethyl ether acetate, propylene glycol propyl ether acetate, dipropylene glycol methyl ether acetate, dipropylene glycol ethyl ether acetate, γ-butyrolactone, and γ-valerolactone; aprotic polar solvents such as acetonitrile, N-methyl pyrrolidinone, N-ethyl pyrrolidinone, N-propyl pyrrolidinone, N-butyl pyrrolidinone, N-hexyl pyrrolidinone, N-cyclohexyl pyrrolidinone, N,N-dimethyl formamide, N,N-dimethyl acetamide, and dimethyl sulfoxide; alcohol solvents such as methanol, ethanol, n-propanol, i-propanol, n-butanol, i-butanol, sec-butanol, t-butanol, n-pentanol, i-pentanol, 2-methylbutanol, sec-pentanol, t-pentanol, 3-methoxy butanol, n-hexanol, 2-methylpentanol, sec-hexanol, 2-ethylbutanol, sec-heptanol, n-octanol, 2-ethylhexanol, sec-octanol, n-nonyl alcohol, n-decanol, sec-undecyl alcohol, trimethylnonyl alcohol, sec-tetradecyl alcohol, sec-heptadecyl alcohol, phenol, cyclohexanol, methylcyclohexanol, benzyl alcohol, ethylene glycol, 1,2-propylene glycol, 1,3-butylene glycol, diethylene glycol, dipropylene glycol, triethylene glycol, and tripropylene glycol; glycol monoether solvents such as ethylene glycol methyl ether, ethylene glycol ethyl ether, ethylene glycol monophenyl ether, diethylene glycol monomethyl ether, diethylene glycol monoethyl ether, diethylene glycol mono-n-butyl ether, diethylene glycol mono-n-hexyl ether, ethoxy triglycol, tetraethylene glycol mono-n-butyl ether, propylene glycol monomethyl ether, dipropylene glycol monomethyl ether, dipropylene glycol monoethyl ether, and tripropylene glycol monomethyl ether; terpene solvents such as α-terpinene, α-terpinenol, myrcene, allo-ocimene, limonene, dipentene, α-pinene, β-pinene, terpinenol, carvone, ocimene and phellandrene; water, and the like. These materials may be used individually or in a combination of two or more thereof.

From the viewpoint of the coating property of the composition for forming a p-type diffusion layer at a substrate, α-terpinenol, diethylene glycol mono-n-butyl ether or 2-(2-butoxyethoxy) ethyl acetate is preferable.

The content of the dispersion medium in the composition for forming a p-type diffusion layer is determined taking into consideration coatability and acceptor concentration.

The viscosity of the composition for forming a p-type diffusion layer is preferably from 10 mPa·s to 1,000,000 mPa·s, and more preferably from 50 mPa·s to 500,000 mPa·s, from the viewpoint of coatability.

In the case in which the total amount of the life time killer element in the glass powder is 1000 ppm or less, the total amount of the life time killer element in the composition for forming a p-type diffusion layer is approximately 1100 ppm or less. Therefore, the total amount of the life time killer element in the composition for forming a p-type diffusion layer is preferably 500 ppm or less, and more preferably 100 ppm or less.

Hereinafter, the method of producing a p-type diffusion layer and a photovoltaic cell in accordance with the present invention will be described.

First, an alkaline solution is applied to a silicon substrate which is a p-type semiconductor substrate, thereby removing the damaged layer, and a texture structure is obtained by etching.

Specifically, the damaged layer of the silicon surface, which is caused at the time of being sliced from an ingot, is removed by using 20% by mass of caustic soda. Then, a texture structure is formed by etching with a mixture of 1% by mass of caustic soda and 10% by mass of isopropyl alcohol. The photovoltaic cell achieves high efficiency through the formation of a texture structure on a light-receiving side (front surface) to promote optical confinement effects.

Next, an n-type diffusion layer is uniformly formed by subjected to a treatment at a temperature of from 800 to 900° C. for several tens of minutes under a mixed gas atmosphere of phosphorus oxychloride ($POCl_3$), nitrogen and oxygen. At this time, according to the method using phosphorus oxychloride atmosphere, the n-type diffusion layer is formed not only on the surface, but also on the side face and the rear surface. For these reasons, there has been a need for a side etching process to remove the n-type diffusion layer of the side face.

Further, the composition for forming a p-type diffusion layer is applied on the n-type diffusion layer formed on the rear surface, i.e., non-light receiving surface. In the present invention, although there is no limit to the application method, for example, a printing method, a spinning method, brush application, a spray method, a doctor blade method, a roll coater method, an inkjet method or the like may be used.

The coating amount of the composition for forming a p-type diffusion layer is not particularly limited, and for example, may be from 0.01 $g/m^2$ to 100 $g/m^2$, and preferably from 0.1 $g/m^2$ to 10 $g/m^2$ as an amount of the glass powder.

Further, depending on the composition of the composition for forming a p-type diffusion layer, a drying process for volatilization of the solvent contained in the composition may be required after the application thereof, if necessary. In this case, the drying is carried out at a temperature of from 80 to 300° C., for from 1 minute to 10 minutes when using a hot plate, or for from 10 minutes to 30 minutes when using a dryer or the like. Since these drying conditions are dependent on the solvent composition of the composition for forming a p-type diffusion layer, the present invention is not particularly limited to the above-stated conditions.

The semiconductor substrate, to which the composition for forming a p-type diffusion layer was applied, is subjected to a heat treatment at a temperature of from 600 to 1200° C. This heat treatment results in diffusion of an acceptor element into the semiconductor substrate, thereby forming an $p^+$-type diffusion layer. The heat treatment may be carried out using a known continuous furnace, batch furnace, or the like. When performing the thermal diffusion treatment, the furnace atmosphere may be appropriately adjusted with air, oxygen, nitrogen, or the like.

The treatment time of the thermal diffusion may be appropriately selected depending on the content of an acceptor element contained in the composition for forming a p-type diffusion layer. For example, the treatment time of the thermal diffusion may be in the range of from 1 minute to 60 minutes, and preferably from 5 minutes to 30 minutes.

As a glass layer is formed on the surface of the $p^+$-type diffusion layer, the glass layer is removed by etching. The etching may be carried out by using a known method, including a method of dipping a subject in an acid such as hydrofluoric acid, a method of dipping a subject in an alkali such as caustic soda, or the like.

In the conventional production method, an aluminum paste is applied to the rear surface and then sintered, thereby converting the n-type diffusion layer into the $p^+$-type diffusion layer and also forming an ohmic contact at the same time. However, since a aluminum paste has low conductivity, in order to reduce a sheet resistance, it is generally necessary to form a thick aluminum layer of about 10 to 20 μm after sintering on the entire rear surface. Furthermore, the coefficient of thermal expansion of aluminum is considerably different from the coefficient of thermal expansion of silicon, and therefore, such a difference results in generation of large internal stress in the silicon substrate during the sintering and cooling processes, which contributes to warpage of the silicon substrate.

The internal stress leads to the problem of damage to a crystal grain boundary resulting in an increase in power loss. The warpage makes a photovoltaic cell prone to damage during conveying of the cell in a module process or during connecting to a copper line which is referred to as a tub line. Recently, owing to improvement in slicing techniques, the thickness of the silicon substrate continues to be mode thinner, whereby the cell is more readily cracked.

On the other hand, according to the production method of the present invention, an n-type diffusion layer is converted into a $p^+$-type diffusion layer with a composition for forming a p-type diffusion layer, and then an electrode is made on the p -layer as another process. Accordingly, the material used for an electrode of the rear surface is not limited to aluminum. For example, Ag (silver), Cu (copper) or the like may also be used, so the thickness of the electrode of the rear surface may be further reduced as compared to the related art, and in addition, there is no need to form an electrode on the whole rear surface. As a result, it is possible to inhibit the generation of internal stress in a silicon substrate and warpage in sintering and cooling processes.

An antireflective film is formed over the n-type diffusion layer. The antireflective film is formed by using a known technique. For example, when the antireflective film is a silicon nitride film, the antireflective film is formed by a plasma CVD method using a mixed gas of $SiH_4$ and $NH_3$ as a raw material. In this case, hydrogen diffuses into crystals, and an orbit which does not contribute to bonding of silicon atoms, that is, a dangling bond binds to hydrogen, which inactivates a defect (hydrogen passivation).

More specifically, the antireflective film is formed under the conditions of a mixed gas $NH_3/SiH_4$ flow ratio of from 0.05 to 1.0, a reaction chamber pressure of from 0.1 to 2 Torr, a film-forming temperature of from 300 to 550° C., and a plasma discharge frequency of 100 kHz or higher.

A metal paste for a front surface electrode is printed and applied on the antireflective film of the front surface (light-receiving side) by a screen printing method, followed by drying to form a front surface electrode. The metal paste for a front surface electrode contains metal particles and glass particles as essential components, and optionally a resin binder, other additives, and the like.

Then, a rear surface electrode is also formed on $p^+$-type diffusion layer. As described hereinbefore, the constitutive material and forming method of the rear surface electrode are not particularly limited in the present invention. For example, the rear surface electrode may also be formed by applying the rear surface electrode paste containing a metal such as aluminum, silver or copper, followed by drying. In this case, the rear surface may also be partially provided with a silver paste for forming a silver electrode, for connection between cells in the module process.

Electrodes are sintered to complete a photovoltaic cell. When the sintering is carried out at a temperature of from 600° C. to 900° C. for from several seconds to several minutes, the front surface side undergoes melting of the antireflective film which is an insulating film, due to the glass particles contained in the electrode-forming metal paste, and the silicon surface is also partially melted, by which metal particles (for example, silver particles) in the paste form a contact with the silicon substrate, followed by solidification. In this manner, electrical conduction is made between the formed surface electrode and the silicon substrate. This type of process is called fire-through.

Hereinafter, the shape of the surface electrode is described. The surface electrode is made up of a bus bar electrode and a finger electrode intersecting the bus bar electrode.

The surface electrode may be formed, for example, by the above-stated screen printing of a metal paste, or plating of electrode materials, deposition of electrode materials by electron beam heating under high vacuum, or the like. The surface electrode made up of the bus bar electrode and the finger electrode is well known since it is typically used as an electrode of the light-receiving surface side, and a known method for the formation of the bus bar electrode and the finger electrode of the light-receiving surface side may be applied.

In the above methods for producing a p-type diffusion layer and a photovoltaic cell, in order to form an n-type diffusion layer on a silicon serving as a p-type semiconductor substrate, a mixed gas of phosphorus oxychloride ($POCl_3$), nitrogen and oxygen is used. However, a composition for forming an n-type diffusion layer may be used to form the n-type diffusion layer. The composition for forming an n-type diffusion layer contains an element of Group XV of the periodic table such as phosphorous (P), antimony (Sb) or the like as a donor element.

In the method using a composition for forming an n-type diffusion layer in order to form the n-type diffusion layer, first, the composition for forming an n-type diffusion layer is applied on a front surface of the p-type semiconductor substrate which is a light receiving surface, the composition for forming an p-type diffusion layer in accordance with the present invention is applied on a rear surface, and then a thermal treatment is carried out at from 600 to 1200° C. This thermal treatment results in diffusion of the donor element into the front surface of the p-type semiconductor substrate to form an n-type diffusion layer, and in diffusion of an acceptor element into the rear surface of the p-type semiconductor substrate to form a $p^+$-type diffusion layer. Aside from these processes, a photovoltaic cell is produced according to the same processes as in the method described above.

The disclosures of Japanese Patent Application No.2010-100223 is incorporated by reference herein in their entireties.

All the literature, patent applications, and technical standards cited herein are also herein incorporated to the same extent as provided for specifically and severally with respect to an individual literature, patent application, and technical standard to the effect that the same should be so incorporated by reference.

EXAMPLES

Hereinafter, Examples in accordance with the present invention will be described in more detail, but the present invention is not limited thereto. Unless specifically indicated, the chemicals all used reagents. Unless specifically indicated, "%" refers to "% by mass".

The term "a life time of a carrier" denotes a relative value of a life time of a carrier in an n-type silicon substrate having a p-type diffusion layer formed in each of the Examples or Comparative Examples, relative to a life time of a carrier in an n-type silicon substrate having a p-type diffusion layer formed by applying a $B_2O_3$-containing solution and then conducting a thermal diffusion treatment. A life time of a carrier of 70% or more is deemed acceptable from a practical perspective.

Example 1

20 g of $SiO_2$—$B_2O_3$ based glass powder whose particle shape is substantially spherical and average particle diameter is 3.3 μm ($SiO_2$: 50 mol %, $B_2O_3$: 50 mol %, life time killer element: 980 ppm), 3 g of ethylcellulose and 77 g of 2-(2-butoxyethoxy) ethyl acetate were mixed with an automatic mortar kneading machine and made into a paste to prepare a composition for forming a p-type diffusion layer.

Regarding a life time killer elements in the glass powder, the content and type of the elements were analyzed with an Inductively Coupled Plasma-Optical Emission Spectrometer and an Inductively Coupled Plasma-Mass Spectrometer. The same applies for the below Examples. In the glass powder, Fe, Cu and Ni were contained as a life time killer element.

The particle shape of the glass powder was judged by observation with a scanning electron microscope (trade name: TM-1000, manufactured by Hitachi High-Technologies Corporation). The average diameter of the glass powder was calculated with a laser diffraction particle size analyzer (measurement wave length: 632 nm, trade name: LS 13 320, manufactured by Beckman Coulter, Inc.).

Next, the prepared paste was applied to an n-type silicon substrate surface by screen printing, and dried on a hot plate at 150° C. for 5 minutes. Subsequently, a thermal diffusion treatment was carried out in an electric furnace at 1000° C. for 10 minutes. Then, in order to remove the glass layer, the substrate was dipped in hydrofluoric acid for 5 minutes, followed by washing with running water and drying.

The surface at the side where the composition for forming a p-type diffusion layer was applied exhibited sheet resistance of 80Ω/☐ and the formation of a p-type diffusion layer through diffusion of B (boron). On the other hand, the rear surface exhibited an unmeasurable sheet resistance of 1,000,000Ω/☐ or higher and it was judged that no p-type diffusion layer was substantially formed. A life time of carrier was 74%. The warpage of the substrate did not occur.

Example 2

A p-type diffusion layer was formed in the same manner as in Example 1, except that the glass powder was changed to $SiO_2$—$B_2O_3$ based glass powder ($SiO_2$: 50 mol %, $B_2O_3$: 50 mol %, life time killer element: 530 ppm, particle shape: substantially spherical, average particle diameter: 3.8 μ). In the glass powder, Fe, Cu and Ni were contained as a life time killer element.

The surface at the side where the composition for forming a p-type diffusion layer was applied exhibited sheet resistance of 82Ω/☐ and the formation of a p-type diffusion layer through diffusion of B (boron). On the other hand, the rear surface exhibited an unmeasurable sheet resistance of 1,000,000Ω/☐ or higher and it was judged that no p-type diffusion layer was substantially formed. A life time of carrier was 82%. The warpage of the substrate did not occur.

Example 3

A p-type diffusion layer was formed in the same manner as in Example 1, except that the glass powder was changed to $SiO_2$—$B_2O_3$ based glass powder ($SiO_2$: 50 mol %, $B_2O_3$: 50 mol %, life time killer element: 470 ppm, particle shape: substantially spherical, average particle diameter: 3.3 μm). In the glass powder, Fe, Cu and Ni were contained as a life time killer element.

The surface at the side where the composition for forming a p-type diffusion layer was applied exhibited sheet resistance of 78Ω/☐ and the formation of a p-type diffusion layer through diffusion of B (boron). On the other hand, the rear surface exhibited an unmeasurable sheet resistance of 1,000,000Ω/☐ or higher and it was judged that no p-type diffusion layer was substantially formed. A life time of carrier was 87%. The warpage of the substrate did not occur.

Example 4

A p-type diffusion layer was formed in the same manner as in Example 1, except that the glass powder was changed to $SiO_2$—$B_2O_3$ based glass powder ($SiO_2$: 50 mol %, $B_2O_3$: 50 mol %, life time killer element: 120 ppm, particle shape: substantially spherical, average particle diameter: 3.7 μm). In the glass powder, Fe, Cu and Ni were contained as a life time killer element.

The surface at the side where the composition for forming a p-type diffusion layer was applied exhibited sheet resistance of 81Ω/☐ and the formation of a p-type diffusion layer through diffusion of B (boron). On the other hand, the rear surface exhibited an unmeasurable sheet resistance of 1,000,000Ω/☐ or higher and it was judged that no p-type diffusion layer was substantially formed. A life time of carrier was 91%. The warpage of the substrate did not occur.

Example 5

A p-type diffusion layer was formed in the same manner as in Example 1, except that the glass powder was changed to $SiO_2$—$B_2O_3$ based glass powder ($SiO_2$: 50 mol %, $B_2O_3$: 50 mol %, life time killer element: 85 ppm, particle shape: substantially spherical, average particle diameter: 3.5 μm). In the glass powder, Fe, Cu and Ni were contained as a life time killer element.

The surface at the side where the composition for forming a p-type diffusion layer was applied exhibited sheet resistance of 80Ω/☐ and the formation of a p-type diffusion layer through diffusion of B (boron). On the other hand, the rear surface exhibited an unmeasurable sheet resistance of 1,000,000Ω/☐ or higher and it was judged that no p-type diffusion layer was substantially formed. A life time of carrier was 95%. The warpage of the substrate did not occur.

Example 6

A p-type diffusion layer was formed in the same manner as in Example 1, except that the glass powder was changed to $SiO_2$—$B_2O_3$ based glass powder ($SiO_2$: 50 mol %, $B_2O_3$: 50 mol %, life time killer element: 20 ppm, particle shape: substantially spherical, average particle diameter: 3.2 μm). In the glass powder, Fe, Cu and Ni were contained as a life time killer element.

The surface at the side where the composition for forming a p-type diffusion layer was applied exhibited sheet resistance of 85Ω/☐ and the formation of a p-type diffusion layer through diffusion of B (boron). On the other hand, the rear surface exhibited an unmeasurable sheet resistance of 1,000,000Ω/☐ or higher and it was judged that no p-type diffusion layer was substantially formed. A life time of carrier was 98%. The warpage of the substrate did not occur.

Example 7

A p-type diffusion layer was formed in the same manner as in Example 1, except that the glass powder was changed to $SiO_2$—$B_2O_3$ based glass powder ($SiO_2$: 50 mol %, $B_2O_3$: 50 mol %, life time killer element: 8 ppm, particle shape: substantially spherical, average particle diameter: 3.5 μm). In the glass powder, Fe, Cu and Ni were contained as a life time killer element.

The surface at the side where the composition for forming a p-type diffusion layer was applied exhibited sheet resistance of 81Ω/□ and the formation of a p-type diffusion layer through diffusion of B (boron). On the other hand, the rear surface exhibited an unmeasurable sheet resistance of 1,000,000Ω/□ or higher and it was judged that no p-type diffusion layer was substantially formed. A life time of carrier was 100%. The warpage of the substrate did not occur.

Comparative Example 1

20 g of $SiO_2$—$B_2O_3$ based glass powder whose particle shape is substantially spherical and average particle diameter is 3.3 μm ($SiO_2$: 50 mol %, $B_2O_3$: 50 mol %, life time killer element: 1180 ppm), 3 g of ethylcellulose and 77 g of 2-(2-butoxyethoxy) ethyl acetate were mixed and made into a paste to prepare a composition for forming a p-type diffusion layer. In the glass powder, Fe, Cu and Ni were contained as a life time killer element.

Next, the prepared paste (composition for forming a p-type diffusion layer) was applied to a p-type silicon substrate surface by screen printing, and dried on a hot plate at 150° C. for 5 minutes. Subsequently, a thermal diffusion treatment was carried out in an electric furnace at 1000° C. for 10 minutes. Then, in order to remove the glass layer, the substrate was dipped in hydrofluoric acid for 5 minutes, followed by washing with running water and drying.

The surface at the side where the composition for forming a p-type diffusion layer was applied exhibited sheet resistance of 80Ω/□ and the formation of a p-type diffusion layer through diffusion of B (boron). On the other hand, the rear surface exhibited an unmeasurable sheet resistance of 1,000,000Ω/□ or higher and it was judged that no p-type diffusion layer was substantially formed. A life time of carrier was 68%, which was lower.

The invention claimed is:

1. A method of forming a p-type diffusion layer, the method comprising:
    providing a composition for forming a p-type diffusion layer, the composition comprising a glass powder and a dispersion medium, wherein the glass powder has a diameter of 10 μm or less and includes an acceptor element and a total amount of a life time killer element in the glass powder is 1000 ppm or less;
    applying the composition for forming a p-type diffusion layer to a semiconductor substrate; and
    conducting a thermal diffusion treatment to diffuse the acceptor element into the semiconductor substrate.

2. The method of claim 1, wherein the acceptor element is at least one selected from boron (B), aluminum (Al) or gallium (Ga).

3. The method of claim 1, wherein the glass powder comprises:
    at least one acceptor element-containing material selected from $B_2O_3$, $Al_2O_3$ or $Ga_2O_3$; and at least one glass component material selected from $SiO_2$, $K_2O$, $Na_2O$, $Li_2O$, BaO, SrO, CaO, MgO, BeO, ZnO, PbO, CdO, $Tl_2O$, SnO, $ZrO_2$ or $MoO_3$.

4. The method of claim 1, wherein the life time killer element is at least one selected from iron (Fe), copper (Cu), nickel (Ni), manganese (Mn), chromium (Cr), tungsten (W) or gold (Au).

5. A method of producing a photovoltaic cell, the method comprising:
    providing a composition for forming a p-type diffusion layer, the composition comprising a glass powder and a dispersion medium, wherein the glass powder has a diameter of 10 μm or less and includes an acceptor element and a total amount of a life time killer element in the glass powder is 1000 ppm or less,
    applying the composition for forming a p-type diffusion layer to a semiconductor substrate of the photovoltaic cell;
    conducting a thermal diffusion treatment to form a p-type diffusion layer in the semiconductor substrate by diffusion of the acceptor element; and
    forming an electrode on the p-type diffusion layer.

6. The method of claim 5, wherein the acceptor element is at least one selected from boron (B), aluminum (Al) or gallium (Ga).

7. The method of claim 5, wherein the glass powder comprises:
    at least one acceptor element-containing material selected from $B_2O_3$, $Al_2O_3$ or $Ga_2O_3$; and at least one glass component material selected from $SiO_2$, $K_2O$, $Na_2O$, $Li_2O$, BaO, SrO, CaO, MgO, BeO, ZnO, PbO, CdO, $Tl_2O$, SnO, $ZrO_2$ or $MoO_3$.

8. The method of claim 5, wherein the life time killer element is at least one selected from iron (Fe), copper (Cu), nickel (Ni), manganese (Mn), chromium (Cr), tungsten (W) or gold (Au).

* * * * *